United States Patent [19]

Woods

[11] Patent Number: 4,725,950

[45] Date of Patent: Feb. 16, 1988

[54] MARINE SEISMIC SIGNAL PROCESSOR WITH D.C. OFFSET COMPENSATION METHOD

[75] Inventor: Theodore E. Woods, Stafford, Tex.

[73] Assignee: Syntrak, Inc., Houston, Tex.

[21] Appl. No.: 746,989

[22] Filed: Jun. 19, 1985

[51] Int. Cl.[4] .................... G01V 1/28; G06F 3/05; H03M 1/00

[52] U.S. Cl. .................... 364/421; 367/21; 367/66; 367/67; 364/551; 364/571

[58] Field of Search ............. 364/421, 200, 900, 571, 364/575, 580, 551, 571; 367/65, 66, 67, 78, 14, 15, 20, 21, 38, 58, 900, 175–178, 75–78, 13; 181/108, 112, 122; 370/26, 114

[56] References Cited

U.S. PATENT DOCUMENTS

| | | | |
|---|---|---|---|
| 3,241,100 | 3/1966 | Loofbourrow | 340/15.5 |
| 3,264,574 | 8/1966 | Loofbourrow | 330/51 |
| 3,333,247 | 7/1967 | Hadley et al. | 340/172.5 |
| 3,603,972 | 9/1971 | Vanderford | 340/347 AD |
| 3,671,931 | 6/1972 | Loofbourrow | 340/15.5 GC |
| 3,673,398 | 6/1972 | Loffbourrow | 235/154 |
| 3,872,465 | 3/1975 | Loofbourrow | 340/347 DA |
| 3,936,819 | 2/1976 | Angelle et al. | 340/347 AD |
| 3,959,770 | 5/1976 | Shaefer | 367/13 |
| 4,031,504 | 6/1977 | Mioduski | 340/15.5 GC |
| 4,104,596 | 8/1978 | Smither | 330/9 |
| 4,158,819 | 6/1979 | Smither | 330/9 |
| 4,233,677 | 11/1980 | Brown et al. | 367/15 |
| 4,276,619 | 6/1981 | Rickenbacker | 367/13 |
| 4,366,561 | 12/1982 | Klein | 367/13 |
| 4,473,797 | 9/1984 | Shiota | 324/115 |
| 4,497,045 | 1/1985 | Miller | 367/78 |
| 4,527,148 | 7/1985 | Kuboki et al. | 340/347 AD |
| 4,594,692 | 6/1986 | Read et al. | 367/77 |
| 4,677,581 | 6/1987 | Malka et al. | 364/580 |

OTHER PUBLICATIONS

An Introduction to Digital and Analog Integrated Circuits and Applications, ©1980, by Sanjit K. Mitra, Harper and Row Publishers, Inc.

Primary Examiner—Errol A. Krass
Assistant Examiner—Steven A. Melnick
Attorney, Agent, or Firm—Arnold, White & Durkee

[57] ABSTRACT

A processor responsive to multiple AC analog signals has individual sampling circuits to sample and hold each AC analog signal in DC form. After the DC signals are multiplexed, a single error correction circuit calculates correction voltages individualized for each sampling circuit and sums them with the DC signals. An instantaneous floating point amplifier amplifies each signal in 12 db increments up to a preselected limit, and then a second sampling circuit holds the amplified signal before an analog-to-digital converter generates a digital signal representative of the amplified signal.

15 Claims, 9 Drawing Figures

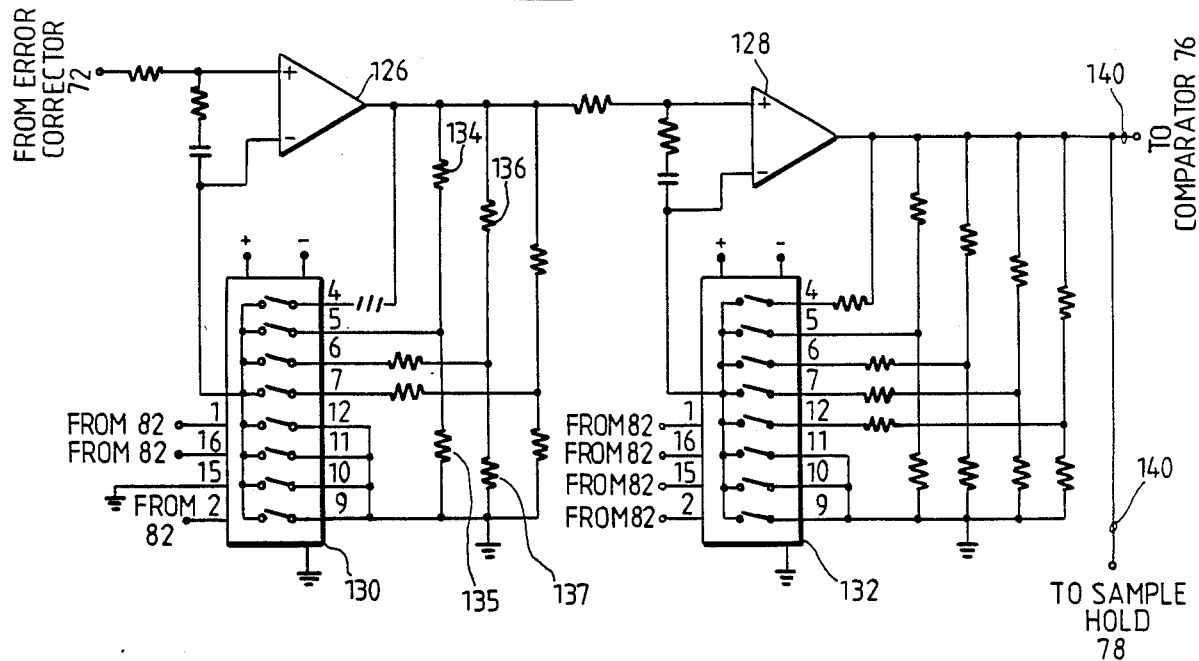
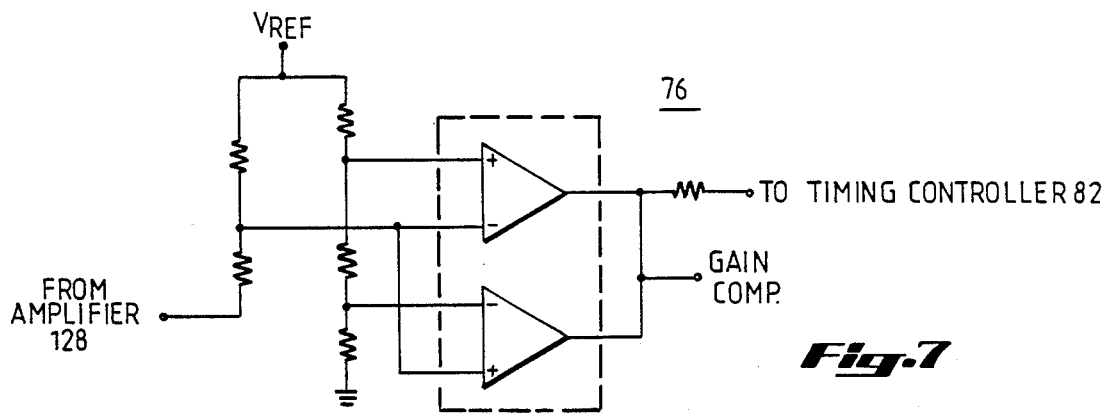
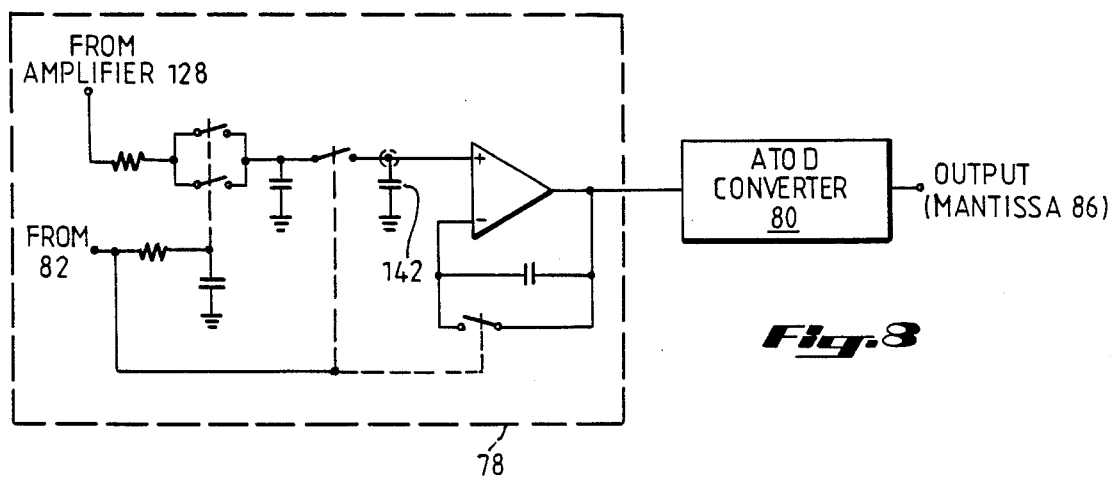

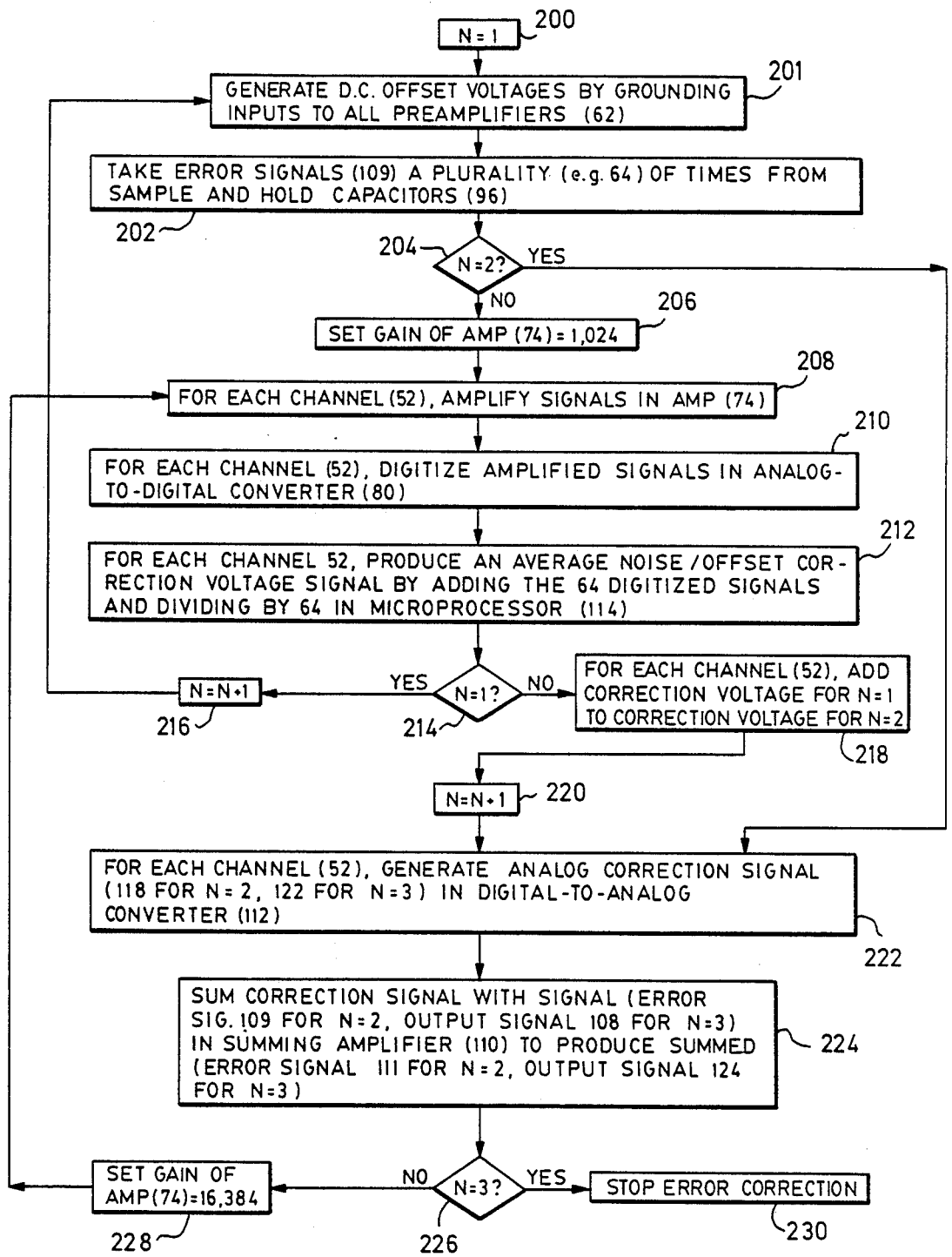

MARINE SEISMIC SIGNAL PROCESSOR WITH D.C. OFFSET COMPENSATION METHOD

BACKGROUND OF THE INVENTION

This application is related to copending, U.S. patent application Ser. No. 869,429.

1. Field of the Invention

This invention relates generally to analog signal processors. More particularly, the present invention relates to analog signal processors which use instantaneous floating point amplifiers to amplify a fluctuating input signal to a level within preselected limits.

2. Description of the Related Art

In land seismic exploration, sound waves are commonly used to probe the earth's crust to determine the types and locations of subsurface formations. The earth's crust can be considered a transmission medium or filter whose characteristics are determined by passing sound waves through that medium. Using reflection seismic techniques, sound waves or impulses are generated at a transmission point at or near the earth's surface, and transmitted toward a subsurface target. The sound waves impinge upon subsurface reflecting boundaries and are reflected back toward the earth's surface where they are received at one or more receiving points. The received waves are detected by seismic detectors, e.g., geophones, which generate electrical signals. The electrical signals, which contain information relating to subsurface formations, are recorded in a form which permits analysis. The shape and depth of subsurface reflection boundaries and the likelihood of finding an accumulation of minerals, such as oil and gas, are discerned from the analysis by skilled interpreters.

In marine seismic exploration, operators on a boat generate sound waves from a location remote from the boat. The boat tows a cable (oftentimes referred to in the trade as "a streamer"), in which sensors are disposed in multiple sections of the cable to detect the reflection of the sound waves from the ocean floor. To obtain accurate data, geologists employ many sensors arranged in short closely spaced arrays in the marine streamer. In known systems, the signals from multiple sensors form one "channel", and each section of the cable has multiple channels. In known systems, each cable section has a controller that samples the signals from each channel.

The outputs of the channels are time-division multiplexed, amplified, digitized and recorded. In known time-division multiplexed systems, the output of each channel is sampled once per sample time, and sample times of one millisecond, two milliseconds, and four milliseconds are used.

First, the amplitude of the input sound waves varies as a function of time. Second, the amplitude of the reflected sound waves decreases with time since recording is continued after the generation of input sound waves is terminated. Therefore special amplifiers, commonly referred to as instantaneous floating point or IFP amplifiers, are used to amplify the output of the channels of a seismic array.

It is undesirable in seismic operations to utilize an amplifier having a fixed gain for two major reasons.

The gain of an IFP amplifier varies depending upon the magnitude of the input signal. The amplifier is usually designed such that the amplifier output, when sampled, is at a level within preselected limits. Typically, the IFP amplifier is designed to amplify the input signal to a level between one-half and full scale output of the amplifier.

Known instantaneous floating point amplifiers include a plurality of cascaded amplifier stages. The number of stages and the gain of each stage determine the maximum gain that the amplifier can apply to the signal presented at its input. A given stage of the amplifier is or is not used, depending upon the amount of gain that must be applied to the input signal to increase its magnitude to within the preselected limits.

Known instantaneous floating point amplifiers also include control circuitry which determines, for each input signal, those stages of amplification which are required to amplify the input signal to within the preselected limits. The control circuitry typically generates a gain word representative of which stages of the amplifier are presently being used to amplify the input signal. It is desirable to minimize the number of stages of amplification required to implement a given amplifier in order to reduce circuit complexity.

One problem with known instantaneous floating point amplifiers is that each stage of amplification has an inherent offset voltage which is amplified together with the input signal. Since it is imperative that the ultimately recorded data be as uncorrupted by noise as possible, the amplified offset voltage must be removed from the amplifier output before later processing begins. Removing the offset voltage is commonly referred to as "nulling" or "zeroing" the amplifier.

Known systems include one sample and hold amplifier per digitizing section, the seismic output from all the channels of a given section being multiplexed onto the one sample and hold. This technique causes an undesirable time shift of the data because only one channel can be sampled and held while amplification and analog-to-digital conversion is being performed on that channel's signal. A time delay exists between the multiplexing of the first signal through the floating point amplifier and the multiplexing of the last signal. Thus, the last signal amplified does not accurately represent the signal received from the hydrophones at the instant in time the first signal amplified is received.

In known systems, the signals from the seismic channels are bipolar signals, which are multiplexed onto a sample and hold or directly to a floating point amplifier. Because of the large dynamic range of signals (on the order of 110 to 120 db), a high signal level on one channel may cause that channel to be capacitively coupled to adjacent channels, giving rise to spurious signals ("cross talk") on those adjacent channels.

Another problem in known systems is that voltage error correction circuitry is required for each sampling circuit. To conserve space, designers of some known systems assume that the voltage errors occurring in each sampling circuit are identical, and thus use only one voltage error correction circuit. In such a system, the correction circuitry sums the identical error correction voltage with each channel's signal.

Yet another problem is the large amount of physical space required for the floating point amplifier. Known systems require several stages of amplification, with DC offset correction circuitry between each stage.

SUMMARY OF THE INVENTION

The above-noted and other drawbacks of the related art are overcome by providing a method and apparatus for processing analog signals which features the capability of simultaneously sampling all channels of seismic signals received from the hydrophones. This is accomplished by having a sample and hold circuit for each channel in which the sampled signal is held before being multiplexed, amplified and digitized. The undesirable time delay between sampling channels, a problem common to known prior art devices, is eliminated by the present invention.

The invention further features a multiplexer which multiplexes the sampled signals, a single correction circuit which performs individual voltage error corrections for each sampling circuit, a two-stage floating point amplifier responsive to the multiplexed summed signals for incrementally amplifying each summed signal within pre-selected limits, and an analog-to-digital convertor for converting the amplified analog signals to digital signals.

An analog signal processor according to the present invention provides a greater degree of accuracy than prior art systems since only DC values are input into the floating point amplifier of the processor.

The undesirable feature of multiple correction circuits for the voltage errors of the sampling circuits in some known prior art devices, and the fallacious assumption of the same voltage error for all sampling circuits in other known prior art devices utilizing only one error correction circuit, have been eliminated by the present invention. The analog signal processor of the present invention is believed to be the first analog signal processor which can achieve individualized voltage error correction for each sampling circuit with only one error correction circuit for all sampling circuits.

The above-noted and other objects and advantages of the present invention will become more apparent from a description of the preferred embodiment when read in conjunction with the drawings.

BRIEF DESCRIPTION OF THE DRAWINGS

FIG. 6 is an electrical schematic diagram of the preferred embodiment of the floating point amplifier 74 of FIG. 3;

FIG. 7 is an electrical schematic diagram of the preferred embodiment of the window comparator 76 of FIG. 3;

FIG. 8 is an electrical schematic diagram of the preferred embodiment of the sample and hold 78 and the analog-to-digital converter 80 of FIG. 1; and FIG. 9 is a flow chart showing the method of the mean offset/noise error correction of the error corrector 72 of FIG. 5.

DESCRIPTION OF THE PREFERRED EMBODIMENT

Figure 1:
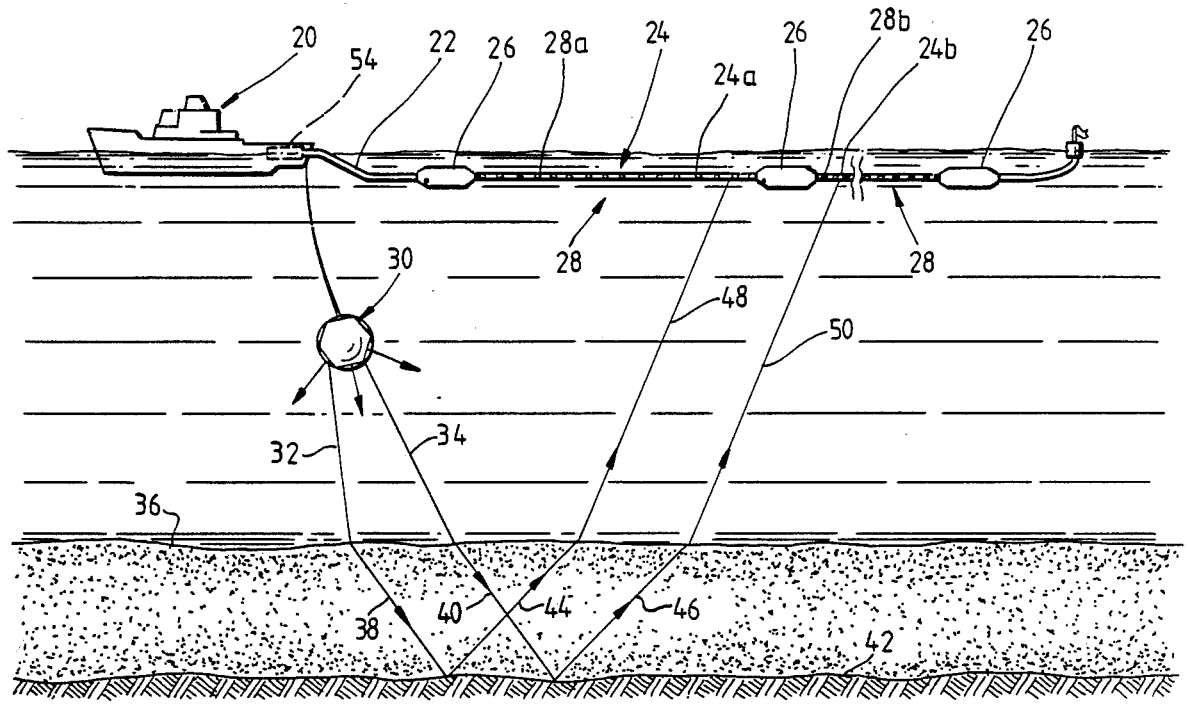
FIG. 1 is an overall schematic view of an illustrative digital telemetry marine seismic system deployed in the ocean, towed behind a boat.

Referring now to the drawings, and in particular to FIG. 1, a seaworthy boat 20 pulls a digital telemetry marine seismic system (referred to hereafter as cable 22) through the ocean. Such a cable 22 is sometimes referred to in the industry as a marine streamer. As is known in the art, the cable 22 includes a flotation medium such as odorless kerosene which gives neutral buoyancy to the cable 22, thus allowing the depth of the cable 22 to be controlled and maintained.

Figure 2:
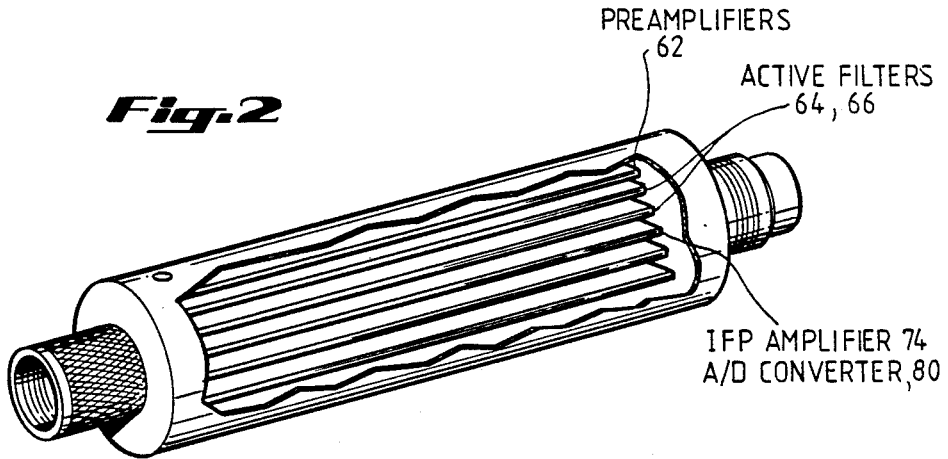
FIG. 2 is a perspective drawing of a data acquisition control module depicting some of the circuits.

The cable 22 is composed of up to forty or more sections 24 which are serially connected via a transmission medium to allow the telemetry of data back to the ship 20. Each section 24 contains a data acquisition control module 26 electrically connected to receive analog output signals generated by twelve groups 28 of hydrophones. Each module 26 digitizes the analog signals in preparation for transmission to the boat 20 via the transmission medium. A representative module 26 is shown structurally in FIG. 2, displaying some of the circuit boards.

The boat 20 also tows through the water a seismic sound source 30. The sound source 30 generates sound waves which are reflected from the ocean floor in a manner indicative of geophysical formations in the ocean floor. The sound waves travel along a variety of paths, such as path 32 and path 34, to the ocean floor 36. At the floor 36 the sound waves are refracted due to the difference in velocity of sound in water and in the earth. The refraction causes the sound waves to travel along a variety of refracted paths, such as paths 38 and 40. The sound waves thereafter are reflected from various subsurface formations, such as subsurface formation 42. After reflection from the subsurface formation 42, the sound waves travel along a variety of paths, such as the reflected paths 44 and 46, to the surface of the ocean floor, where they are again reflected. The sound waves thereupon travel along a variety of paths such as 48 and 50 through the water, and they reach the cable 22.

Sound waves traveling along wave paths nearer the boat 20, such as the ray path 48, will be detected by the twelve groups 28a of hydrophones in the near section 24a of the seismic cable 22. Other sound waves will travel along wave paths such as the path 50 and will be detected by the twelve groups 28b of hydrophones in the more distant sections such as the section 24b of the seismic cable 22. In response to the sound waves, the twelve groups 28 of hydrophones generate twelve channels 52 as in FIG. 3 of analog signals representative of the sound waves, and the channels 52 of signals are communicated to the modules 26.

A digital control and recording system 54 is disposed on the boat 20 and is connected to the cable 22. The system 54 generates control signals for generally controlling operations of the modules 26. Especially the control signals command the analog signal processor 58 of the present invention in each of the given modules 26 to simultaneously sample and then digitize all twelve channels 52 of analog signals into digitized seismic data signals. The modules 26 then transmit the digitized signals to the recording system 54 for processing.

Other than generating the control signals in the proper format, the system 54 forms no part of the invention. Conventional digital signal generation and processing techniques may be employed to implement the system 54 in accordance with the present disclosure.

Figure 3:
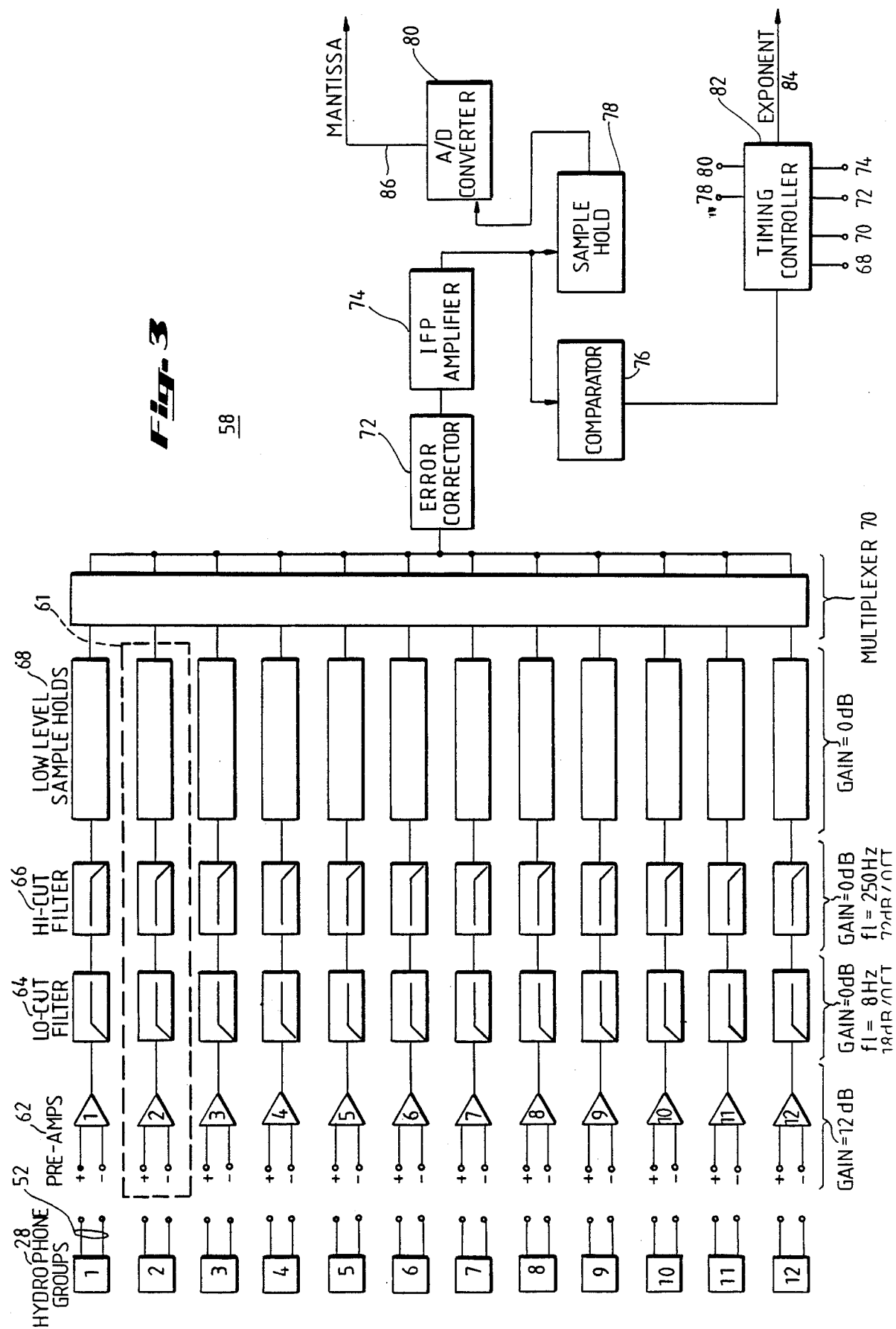
FIG. 3 is an electrical schematic in block diagram form of an embodiment of an analog signal processor according to the present invention.

Referring now to FIG. 3, an analog signal processor 58 according to the present invention includes twelve individual sampling channels 61, each of which receive the output from its respective group 28 of hydrophones. Each sampling channel 61 includes a preamplifier 62 connected to receive an output signal from one of the groups 28 of hydrophones. The output of the preamplifier 62 is coupled to a low-cut filter 64 whose output is coupled to a high-cut filter 66. And, the output signal of the high-cut filter 66 is in turn coupled to a low level sample and hold circuit 68. The output signal from each of the 12 low level sample and holds 68 is coupled to a multiplexer 70, whose output is coupled to an IFP amplifier 74. The output of the IFP amplifier 74 is coupled to a comparator 76 and to a sample and hold 78. The output of the sample and hold 78 is coupled to an analog-to-digital converter 80. The output of the comparator is coupled to a microprocessor timing controller 82, and to the IFP amplifier 74. The timing controller 82 is coupled to the sample and hold circuit 68, the multiplexer 70, the error corrector 72, the IFP amplifier 74, the comparator 76, the sample and hold 78, and to the analog-to-digital converter 80.

The timing controller 82 controls the timing of the operations of the other elements of the analog signal processor 58. The timing controller 82 also generates a three-bit exponent 84 which is part of the digitized seismic data. The rest of the digitized seismic data, which is a fifteen-bit mantissa 86, is the output of the analog-to-digital converter 80.

The preamplifier 62 has a gain of 12 decibels. The low-cut filter 64 has unity gain, a low frequency cutoff of 8 Hz, and an attenuation slope of 18 decibels per octave. The high-cut filter 66 has unity gain, a high frequency cutoff of 250 Hz, and an attenuation slope of 72 decibels per octave. The low level sample and holds 68 have unity gain.

Figure 4:
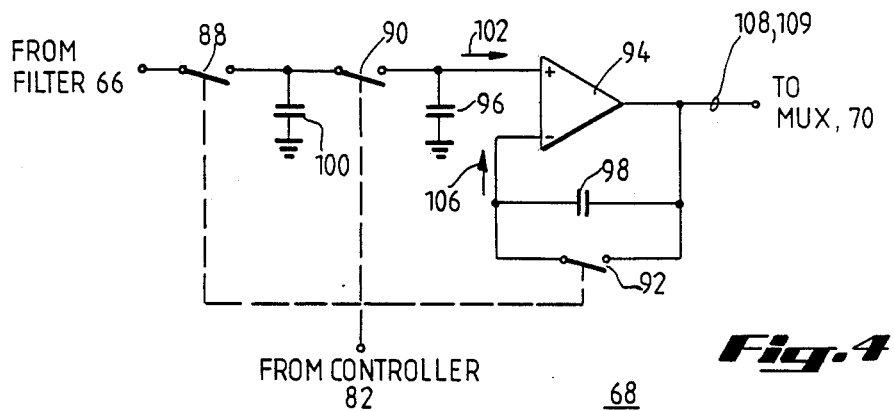
FIG. 4 is an electrical schematic diagram of the low level sample and holds 68 of FIG. 3.

Referring now to FIG. 4, depicted is one of the twelve identically constructed low level sample and holds 68. The low level sample and hold 68 includes a switch 88 which is connected to a capacitor 100 and a switch 90. The switch 90 is similarly connected to a capacitor 96 and the plus input of a differential operational amplifier 94. Connected in parallel to the negative input of the operational amplifier 94 is a capacitor 98 and a switch 92. The switches 88, 90, and 92 are controlled by the controller 82. The switches 88, 90 and 92 are J-FETS, Model No. 2N4416A, manufactured by Siliconix. The differential operational amplifier 94 is an operational amplifier manufactured by Precision Monolithics, Model No. OP12EJ. The capacitors 96 and 98 each have the same value of capacitance.

With continued reference to the low level sample and hold 68, in operation, the controller 82 opens the switches 90 and 92 simultaneously. When the switch 90 opens, a representation of the preamplified and filtered input signal 52 is stored on the capacitor 96. When switch 90 opens, a small offset voltage called a "charge offset" or "charge step" voltage occurs across the capacitor 96. This small residual charge appears at the plus input of the operational amplifier 94. Since the switch 92 is identical to the switch 90, and since the capacitor 98 is identical to the capacitor 96, an identical amount of offset voltage to what appeared at the plus input also appears at the minus input of the differential operational amplifier 94. Thus, the two charge offsets cancel each other because they are at opposite inputs of the differential amplifier. Therefore, the net output error voltage from the operational amplifier 94 due to charge injection is very close to zero.

The controller 82 opens the switch 88 after the switches 90 and 92 have been opened. The controller 82 times the opening of the switch 88 such that the DC voltage across the capacitor 100 is approximately equal in magnitude to the voltage held on the capacitor 96 and representative of its input signal. Opening the switch 88 increases the isolation of the sample and hold capacitor 96 from the time-varying signal 52, thus decreasing the possibilities of any feed-through errors.

When the switches 88, 90 and 92 are open, an input bias current 102 flows into the plus input of the operational amplifier 94, tending to discharge the capacitor 96. This discharge is referred to as "droop" in sample and hold theory. In an ideal system, the capacitor 96 holds its charge forever, maintaining the voltage across it forever, and therefore a zero-magnitude voltage change occurs across the capacitor 96. In real systems, however, the input bias current 102 causes a discharging of the capacitor 96.

To offset the error caused by the non-zero input bias current 102, the low level sample and holds 68 are constructed as shown in FIG. 4 so that an input bias current 106, which is substantially equal in magnitude to the input bias current 102, flows into the negative input of the differential operational amplifier 94. Since the currents 102 and 106 flowing into the different inputs of the differential operational amplifier 94 tend to cancel the effect of each other, the effect of the droop of the holding capacitor 96 is negated.

Figure 5:
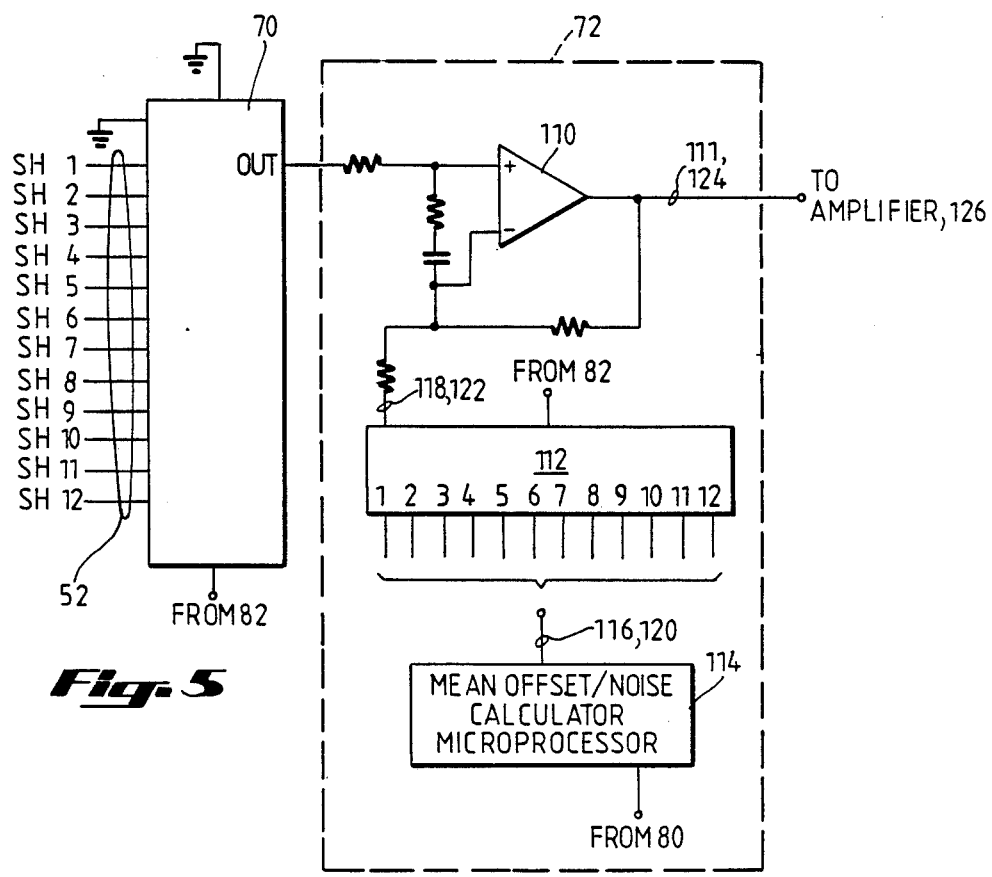
FIG. 5 is an electrical schematic diagram of the preferred embodiment of the multiplexer 70 and error corrector 72 of FIG. 3.

Referring now to FIG. 5, the outputs from the twelve low level sample and holds 68 are coupled to the input of the multiplexer 70. The multiplexer 70 in the illustrated embodiment is a Model No. IH6116, manufactured by Intersil Semiconductor Corporation. In operation, the multiplexer 70 sequentially selects the output signals 108 from the low level sample and holds 68 and applies them in sequence to the error corrector 72.

The error corrector 72 includes a summing amplifier 110 coupled to a digital-to-analog converter 112. The converter 112 is coupled to a mean offset/noise calculator 114. The summing amplifier 110 in the illustrated embodiment is an operational amplifier, Model No. OP37EJ, manufactured by Precision Monolithics. The illustrated digital-to-analog converter 112 is a Model No. DAC347LPC12G, manufactured by Hybrid Systems. The mean offset calculator 114 may include any circuitry that digitally performs the two-stage averaging algorithm described below. For example, a Model No. 80C39, manufactured by NEC Corporation may be used as the microprocessor in the circuitry.

Referring now to FIG. 9, in operation of the error corrector 72, the shipboard digital control and recording system 54 sends a command or control signal to the data acquisition control modules 26 to ground the inputs to all the preamplifiers 62 (Steps 200 and 201). With these inputs grounded, no signal can be present on the sample and hold capacitors 96 except for amplifier noise and DC offset voltage. The shipboard digital control and recording system 54 sends one command so that from each of the twelve seismic channels 52 associated with each data acquisition control module 26, sixty-four error samples 109 are taken and digitized (Step 202).

The process of taking the error sample 109 of the amplifier noise and DC offset voltage sixty-four times is repeated twice. The first sixty-four times, the error sample 109 is amplified by the floating point amplifier 74, using a fixed gain of one thousand twenty-four (Step 206). The amplified samples are then transmitted to the analog-to-digital converter 80, where they are digitized and then transmitted to the mean offset/noise calculator 114 (Step 210). For each of the twelve channels 52 of signals the calculator 114 sums the sixty-four digitized samples and then divides by sixty-four. The resulting value is the first stage average noise/offset voltage 116 which closely approximates zero (Step 212).

In the second stage (Step 216) of the correction process, sixty-four error samples 109 are again taken (Steps 201-202). This time (Step 204), however, the microprocessor 114 transmits the first stage correction voltage word 116 for each of the channels 52 of signals to the digital-to-analog converter 112, which in turn generates for each channel an analog correction signal 118 representative of the noise and DC offset voltage for the sampling circuit 68 of that particular channel (Step 222). The analog correction signal 118 is summed with the error signal 109 from each low level sample and hold circuit 68 by the summing amplifier 110, producing a summed error signal 111 (Step 224). The summed error signal 111 is then transmitted to the floating point amplifier 74 (Steps 226-228).

In the second stage of offset/noise correction, the floating point amplifier 74 amplifies the summed error signal 111 with the gain of the amplifier 74 being fixed at 16,384 (Steps 228 and 208). As in the first stage, the signal 111 is digitized and the average of sixty-four such digitized (Step 210) signals is calculated for each of the channels (Step 212), resulting in a correction voltage word for each channel. That correction voltage word is added to the first stage correction voltage word 116 to give a final second stage correction voltage word 120 for each of the channels (Step 218). The second stage correction voltage word 120 is transmitted to the digital-to-analog converter 112 which in turn generates a second stage analog correction signal 122 for each of the channels (Step 222).

The summing amplifier 110 sums the second stage analog correction signal 122 for each of the channels with each output signal 108 from each of the twelve low level sample and holds 68 to produce an output signal 124 (Step 224). The output signal 124 for each channel is then transmitted to the floating point amplifier 74 (Steps 226 and 230).

Referring now to FIG. 6, the illustrated floating point amplifier 74 includes two operational amplifiers 126 and 128, preferably of the type manufactured by Precision Monolithics, Model No. OP37EJ. Also included are two multiplexer chips 130 and 132, preferably of the type manufactured by Intersil, Model No. IH6108CJE, and various resistors and capacitors, including resistors R134, R135, R136 and R137.

In operation, the operational amplifier 126 can have one of four possible gain states. The first gain state is a unity gain state in which the switch connected to pin 4 of the multiplexer 130 is closed, thereby connecting the output of the amplifier directly back to its minus input.

The second gain state has a gain of four, which is twelve decibels of amplification. This occurs when the switch connected to pin 5 of the multiplexer chip 130 is closed. The gain of four is determined by the formula: gain = 1 + (R134)/(R135) = 4.

Similarly, the third gain state has a gain of 16, calculated by the formula: gain = 1 + (R136)/(R137) = 16. The gain of 16 occurs when the switch connected to pin 6 of the multiplexer chip 130 is closed.

Finally, when the switch connected to pin 7 of the multiplexer chip 130 is closed, a gain of 64 is produced.

The gain states for operational amplifier 128 of the second stage are similarly produced, with the additional feature that when the switch connected to pin 12 of the multiplexer chip 132 is closed, the amplifier 128 has a gain of two hundred fifty-six. Thus, the maximum gain available through the two stages of the floating point amplifier 74 is 16,384, which is approximately eighty-four decibels. Since the gain steps are available in multiples of four, this type of floating point amplifier is referred to as a quaternary floating point amplifier.

In operation of the floating point amplifier 74, the output signal 124 from the summing amplifier 110 is transmitted to the positive input of the operational amplifier 126. The timing controller 82 sequences the operational amplifiers 126 and 128 so that the first time through the signal 124 sees only a unity gain. An output signal 140 from the operational amplifier 128 is then transmitted to the comparator 76.

Referring now to FIG. 7 in the illustrated embodiment, the comparator 76 includes a chip such as Model No. LM393H, manufactured by National Semiconductor. In operation, the comparator 76 compares the output signal 140 with the full-scale value desired by the shipboard digital control and recording system 54. When the output signal 140 is greater than one-fourth of the full-scale value, then the comparator signals the timing controller 82 to stop sequencing the gain of the floating point amplifier 74. When the output signal 140 is not greater than a quarter full-scale, another gain step is sequenced by the timing controller 82.

When the timing controller 82 signals the floating point amplifier 74 to stop sequencing the gain, the controller 82 also signals the sample and hold 78 to sample and hold the output signal 140. Thereafter, the timing controller 82 signals the multiplexer 130 to close the switch connected to its pin 4, and at the same time signals multiplexer 132 to close the switch connected to its pin 4. Thus, the timing controller resets the IFP amplifier 74 to a unity gate state, in preparation for the amplifier 74 to receive another signal 108. Thereafter, the timing controller 82 signals the multiplexer 70 to transmit another output signal 108 from a different channel 52 of analog signals.

Referring now to FIG. 8, while a subsequent signal 108 is being processed through the error corrector 72 and the floating point amplifier 74, the present output signal 140 held by the sample and hold 78 is transmitted to the analog-to-digital converter 80. Thus, while the analog-to-digital converter 80 is performing the conversion on one channel signal 52, another channel signal can be processed through the floating point amplifier 74. Thus, the sample and hold 78 allows the analog signal processor 58 to be processing signals from two different channels at the same time.

In the illustrated embodiment, the sample and hold 78 includes an operational amplifier Model No. OP15FJ, manufactured by Precision Monolithics, and various switches, resistors and capacitors. The circuitry of the sample and hold 78 is similar in structure to the circuitry of the low level sample and holds 68, so that parasitic voltages and "droop" of the holding capacitor 142 are minimized. The analog-to-digital converter 80 in the illustrated embodiment includes a converter such as the type built by Micro Networks, Model No. MN5290H/B.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

What is claimed is:

1. In a data acquisition module of a digital marine seismic system, an analog signal processor for amplifying analog signals received from hydrophones to a level below a preselected limit and for generating digitized signals representative of said analog signals, said processor comprising:

a separate sampling circuit for generating a sampled signal for each analog signal, each of said sampling circuits including:
an operational amplifier having a negative input, a positive input and an output;
first and second switches, each of said switches being substantially identical; and
first and second capacitors, each of said capacitors being substantially identical;
said first switch and said first capacitor being connected to said positive input, and said second switch and said second capacitor being connected in parallel across said negative input and said output;

a multiplexer conductively coupled to receive each of said sampled signals for multiplexing said sampled signals;

a microprocessor controlled digital correction circuit conductively coupled to said multiplexer to receive each of said sampled signals and for generating for each of said sampled signals and its respective sampling circuit an error correction voltage representative of an average combined DC offset voltage error and a sampling switch parasitic voltage error, and for summing the negative of said error correction voltage with said sampled signal to generate a corrected sampled signal;

a two-stage floating point amplifier conductively coupled to receive each of said corrected sampled signals, for selectively amplifying said corrected sampled signals by a preselected gain state of a plurality of gain states in a first stage and by a preselected gain state of a plurality of gain states in a second stage to produce an amplified signal;

a comparator conductively coupled to receive said amplified signal for comparing said amplified signal with said preselected limit, and for generating an amplification signal to selectively increase amplification by said preselected gain states in said first and second stages;

a sample and hold circuit for receiving and holding said amplified signal; and an analog-to-digital converter conductively coupled to said sample and hold circuit to receive said amplified signal for generating said digitized signals, wherein the correction circuit uses the floating point amplifier to generate the corrected sampled signal.

2. The apparatus of claim 1 wherein said first gain state is unity.

3. The apparatus of claim 1 wherein said amplification is selectively increased in 12 decibel increments.

4. The processor of any of claims 1-3 wherein the correction circuit sums a first generated average correction voltage with a second generated average correction voltage to produce a final average correction voltage for summing the negative of the final average correction voltage with the sampled signals.

5. The processor of claim 4 wherein the first and second average correction voltages are each generated by averaging at least ten sampled signals.

6. The processor of claim 5 wherein the first and second average correction voltages are each generated by averaging sixty-four sampled signals.

7. In a processor of analog sample signals in a digital marine seismic system, the signals representative of data from hydrophones, the system having preamplifiers for generating the sample signals, a method of generating corrected sample signals, corrected for D.C. offset voltages comprising the steps of:

(a) generating first signals representative of the D.C. offset voltages of the preamplifiers;
(b) sampling the first signals a plurality of times to generate first error signals;
(c) amplifying the first error signals at a first level of amplification to generate first amplified error signals;
(d) digitizing the first amplified error signals to generate first digitized error signals;
(e) averaging the first digitized error signals to generate first averaged digitized error correction signals;
(f) generating first averaged analog error correction signals from the first averaged digitized error correction signals;
(g) repeating steps a and b to generate second error signals;
(h) summing the negative of the first averaged analog error correction signals with the second error signals to generate summed error signals;
(i) amplifying the summed error signals at a second level of amplification which is greater than the first level of amplification to generate second amplified error signals;
(j) digitizing the second amplified error signals to generate second digitized error signals;
(k) averaging the second digitized error signals to generate second averaged digitized error correction signals;
(l) summing the first and second averaged digitized error correction signals to generate summed digitized error correction signals;
(m) generating summed analog error correction signals from the summed digitized error correction signals;
(n) sampling second signals representative of data from hydrophones; and
(o) adding the summed analog error correction signals to the second signals to generate corrected sample signals.

8. The method of claim 7 wherein the second level of amplification is at least five times greater than the first level of amplification.

9. The method of claim 7 wherein the second level of amplification is at least ten times greater than the first level of amplification.

10. The method of claim 7 wherein the first level of amplification has a gain of 1,024, and the second level of amplification has a gain of 16,384, and wherein in the step of generating a first signal the inputs of the preamplifiers are grounded.

11. The method of claim 7 wherein the plurality of times is greater than twenty times.

12. The method of claim 7 wherein the plurality of times is greater than sixty times, and wherein in the step of generating a first signal the inputs of the preamplifiers are grounded.

13. In a processor of analog sampled signals in a digital marine seismic system, a method of generating corrected analog sampled signals, corrected for amplifier noise and D.C. offset voltages, the signals representative of data from hydrophones, the system having pre-amplifiers for generating the sampled signals, the method comprising the steps of:
 (a) generating a first average correction voltage indicative of amplifier noise and D.C. offset voltage at a first level of processor amplification;
 (b) generating a second average correction voltage indicative of amplifier noise and D.C offset voltage at a second level of processor amplification, wherein the second level is greater than the first level;
 (c) summing the first and second average correction voltages to generate a final average correction voltage; and
 (d) summing the negative of the final average correction voltage with the sampled signals to generate corrected analog sampled signals.

14. The method of claim 13 wherein each of the first two steps of generating include averaging at least ten sampled signals.

15. The method of claim 13 wherein each of the first two steps of generating include averaging sixty-four sampled signals.

* * * * *